United States Patent [19]

Bourassa

[11] Patent Number: 4,592,128

[45] Date of Patent: Jun. 3, 1986

[54] METHOD FOR FABRICATING INTEGRATED CIRCUITS WITH POLYSILICON RESISTORS

[75] Inventor: Ronald R. Bourassa, Colorado Springs, Colo.

[73] Assignee: Inmos Corporation, Colorado Springs, Colo.

[21] Appl. No.: 616,921

[22] Filed: Jun. 4, 1984

[51] Int. Cl.$^4$ ............... H01L 21/22; H01L 21/306
[52] U.S. Cl. .................... 29/571; 29/576 B; 29/576 R; 29/578; 148/1.5; 148/DIG. 102; 427/93; 156/659.1; 357/59
[58] Field of Search ............. 29/571, 576 B, 576 R, 29/577, 578, 589; 148/1.5, 187, DIG. 82, DIG. 122, DIG. 83, DIG. 123, DIG. 102, DIG. 117, DIG. 124, DIG. 141, DIG. 125; 427/93, 94; 156/654, 657, 659.1, 653; 357/59, 40

[56] References Cited

U.S. PATENT DOCUMENTS

| | | | |
|---|---|---|---|
| 3,514,676 | 5/1970 | Fa | 148/33 X |
| 4,234,362 | 11/1980 | Riseman | 357/59 X |
| 4,287,661 | 9/1981 | Stoffel | 357/59 X |
| 4,432,006 | 2/1984 | Takei | 357/59 X |

FOREIGN PATENT DOCUMENTS 1208578 10/1970 United Kingdom .

Primary Examiner—Donald L. Walton
Assistant Examiner—David A. Hey
Attorney, Agent, or Firm—Edward D. Manzo

[57] ABSTRACT

A poly layer on a substrate is covered with nitride. A reverse tone load implant mask and etch opens an area, which is then boron implanted. Controlled oxidation follows to grow oxide on the boron-doped region only, thereby thinning the poly there. Strip the nitride and then dope the poly layer. The oxide shields the boron-doped region from further substantial doping. Next, apply a poly definition photoresist mask. Etch the exposed oxide and poly to define a poly line having a boron-doped resistor therein. The difference in etch rates between heavily doped and lightly doped poly is compensated for by the adjustment of thickness of the boron-doped region. Hence, the etch for both types of poly concludes at about the same time, leaving the underlying layers substantially intact. Sources and drains may be implanted thereafter without an additional load implant mask.

31 Claims, 11 Drawing Figures

METHOD FOR FABRICATING INTEGRATED CIRCUITS WITH POLYSILICON RESISTORS

BACKGROUND OF THE INVENTION

The present invention generally relates to the art of semiconductor fabrication. More particularly, the present invention relates to an improvement in the processing of integrated circuits which have resistors in a polysilicon ("poly") layer.

Resistors, particularly poly resistors, are used in many circuits in semiconductors developed on monocrystalline silicon substrates, especially static RAMS. Poly resistors can be formed by doping an entire layer of poly overlying a substrate with only a light concentration of dopant such as boron, and then, using a poly doping mask, doping remaining or other selected parts of the polysilicon layer more heavily with a dopant such as arsenic or phosphorous. One disadvantage, however, to this process is that it introduces boron in many areas of the device in which it is not useful or detrimental to the device.

Another disadvantage of this usual method of fabrication involves differences in etch rates of poly with more than one level of doping. After doping, in separate steps, the resistive areas and the desired conductive regions through masking processes, the subsequent masked etching (using a poly definition mask) removes the poly in a predetermined pattern to define desired poly lines, some of which will contain resistors. However, the poly regions which are only lightly doped will etch away at a slower rate than the more heavily doped regions of the poly, especially when a dry etch is used. Because the highly doped poly will be totally removed much sooner than the lightly doped poly, the underlying oxide or substrate near the conductive regions of the poly will be partially or totally consumed before the lightly doped regions of the poly are fully etched. If this oxide is consumed, the device will fail. Also, as more dense circuits are developed, the underlying oxide layer becomes thinner overall, thereby further aggravating this problem.

Another aspect of the background to this invention concerns the number of masks which are used. According to the usual process, after the poly line containing a resistor is doped and defined (requiring two masks—a poly doping mask and a poly definition mask), there will generally be implants to the substrate or other regions. This will require the resistors to be protected by a load implant mask (a third mask). Thus, this prior method requies at least three separate masks in fabricating semiconductor integrated circuit with polysilicon resistors.

The cost of fabrication of semiconductors is directly related to the number of discrete steps needed in a fabrication process. Each separate mask increases this cost. Moreover, each additional mask in a fabrication process reduces the yield per wafer, which is a vital concern.

Accordingly, it is an object of the present invention to provide a method for fabricating resistors in poly which would allow the resistor elements to be doped without introducing boron or other resistor dopants into other portions of the polysilicon layer.

Another object of the present invention is to provide a method of semiconductor fabrication wherein the lightly doped resistive portions and the highly doped conductive portions of a polysilicon layer may be removed without detrimentally consuming the underlying oxide or substrate.

Still a further object of the present invention is to provide a method for semiconductor fabrication including the definition of resistors which reduces the number of discrete masking steps.

SUMMARY OF THE INVENTION

The preferred embodiment of the invented method may begin with a poly layer separated from a substrate by a first oxide layer. A thin layer of a substance which inhibits oxidation, such as nitride, is then put on the polysilicon layer. At this time, a mask related to a load implant mask is used, and the nitride layer is etched selectively to expose areas of the polysilicon which are to become resistors. Illustratively, a reverse tone load implant mask is used. Preferably the exposed poly area is broader than just the resistor areas. These exposed areas of poly are then lightly doped (with boron, for instance) to form a lightly doped region of poly. Other parts of the poly will not have been subjected to this light doping. According to this aspect of the invention, then, the resistor dopant can be prevented from entering any parts of the poly layer which will become poly lines.

A protective covering is next established over the designated resistor areas without using an additional mask. Preferably this is done simply by an oxidation of the entire lightly doped poly region. With the nitride layer still in place over the non-resistor region, oxide is grown over the lightly doped region. One further purpose in this step is to consume some of the poly in this lightly doped region. This is controlled so that the amount of unoxidized poly in the lightly doped region is fairly precisely known.

The nitride layer is then removed, and then the remainder of the polysilicon layer is heavily doped with a dopant such as arsenic or phophorous. The previously grown oxide over the lightly doped region acts as a doping mask. Some polysilicon is used up if conventional furnace doping is used.

Depending upon the desired final semiconductor structure, such as a static RAM, the poly lines may now be defined by etching the polysilicon layer in a pattern to leave, for example, a heavily doped poly line having a lightly doped region, which can now be called a resistor. This step may involve first placing the poly definition photoresist, then performing an oxide etch (to remove the oxide from all regions except the tops of the resistors), followed by a poly etch. The oxide etch should have good selectivity to poly. Because of the prior oxidation of the top part of the lightly doped poly resistive region (which includes the areas of the poly line to become resistors and the adjacent area), the lightly doped poly underneath the oxide will be thinner than the complementary, remaining portions of the poly layer which will have been more heavily doped. Now, because heavily doped poly etches faster than lightly doped poly, and because there is now less of the lightly doped poly to be etched compared to the thicker, heavily doped regions, the poly definition etching process will be completed at approximately the same time for both the lightly doped and heavily doped regions of the poly layer. This avoids damage to the underlying oxide layer covering the substrate.

Thus, according to another aspect of this invention, the slower etch rate for the lightly doped poly region is compensated for by reducing the poly thickness in those areas. In this fashion, polysilicon lines, some of which contain resistors, may be defined without damaging the oxide layer which overlies the substrate regions between the defined polysilicon lines.

Now, depending upon the type of semiconductor device being fabricated, such as a static RAM, the process may be continued. A further thin oxide layer may be grown on the poly lines and then doped regions defined in the underlying substrate in the areas between the poly lines. These doped regions, e.g. source and drain regions, between the poly lines may be defined by implanting impurities through the oxide layer into the substrate between the poly lines with the thick oxide layer on the resistors serving as a load implant mask. No extra, separate load implant mask is needed.

It will be appreciated that some of the features of the invention are: (1) opening resistor areas early in the process, illustratively through the use of a reverse tone load implant mask combined with installing a nitride layer on the poly and a nitride etch; (2) doping only the resistor areas of poly instead of the entire poly layer; (3) thinning the poly areas which are to be resistors in order to compensate for differentials in the etch rate of heavily doped poly compared to lightly doped poly, illustratively by oxidizing part of the resistor area (followed by removing such oxide); (4) developing a load implant mask without a separate masking step, e.g. using the oxide on the resistor areas as a doping mask; (5) forming a mask on the resistor areas prior to a poly definition and (6) reducing the number of masks which must be separately applied to the structure. With regard to the latter feature, whereas prior processing has involved three masking steps as discussed, the present invention according to one of its aspects involves but two masking steps (reverse tone load implant mask and then poly definition mask)—a third mask being developed in the process without a separate masking step.

BRIEF DESCRIPTION OF THE DRAWINGS

The features of the present invention are set forth with particularity in the appended claims. The invention, together with its objects and advantages thereof may be further understood by reference to the following detailed description taken in conjunction with the accompanying drawings in which like elements are indicated with like reference numerals. The drawings are not to scale in that the photoresist masks such as 38 in FIG. 3 is actually thicker than (twice as thick as) the poly layer beneath it.

DESCRIPTION OF A PREFERRED EMBODIMENT

Figure 1:
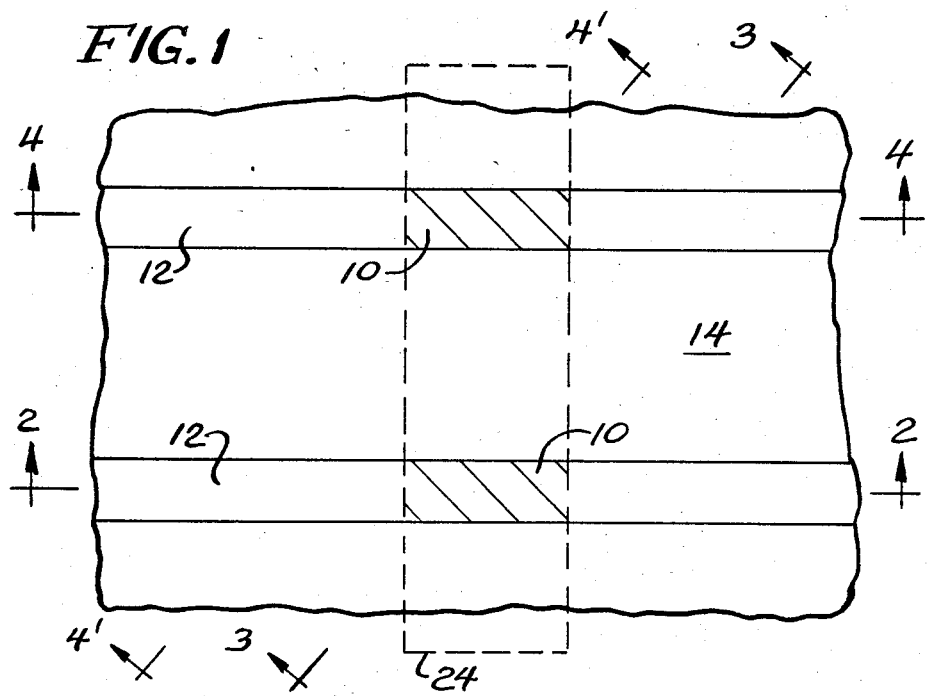
FIG. 1 is a top view of a small portion of a silicon wafer during one time in the fabrication of a semiconductor device according to the method of the present invention. It shows view lines 2—2, 3—3, 4—4 and 4'—4' for the following drawings.

The present invention generally provides a method for fabricating poly resistors in a semiconductor structure developed on a monocrystalline silicon substrate. FIG. 1 shows a portion of a silicon wafer 14 having two polysilicon lines 12 containing resistors 10. The dopant used in resistors 10 is confined therewithin and does not impair the conductivity of or enter the remaining portions of the polysilicon lines 12. Additionally, the present invention provides for etching of the lightly doped and heavily doped polysilicon areas wherein total etching of both poly regions is concluded at substantially the same time, and without damaging the underlying oxide layer 16 (not visible in FIG. 1) or substrate 14. Also, the present invention allows the fabrication of semiconductor devices utilizing a fewer number of discrete masking steps.

Figure 2A:
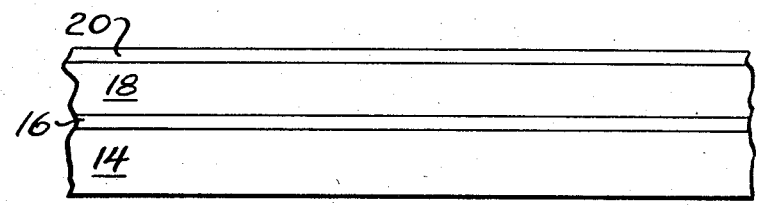
FIGS. 2A-D are cross-sectional views through line 2—2 of FIG. 1 but at varying times in the preferred embodiment of the invented method.

As shown in FIG. 2A, a process according to the present invention can start with monocrystalline silicon substrate 14 having a thin oxide layer 16 separating it from a polysilicon layer 18. Layer 16 may have a thickness of about 200 Angstroms, and poly layer 18 may have a thickness of about 6000 Angstroms. A thin layer of silicon nitride 20 is developed on the polysilicon layer 18. This can be done using a standard nitride process, such as the CVD process. The thickness of nitride layer can be about 500 to 1000 Angstroms.

Figure 2B:
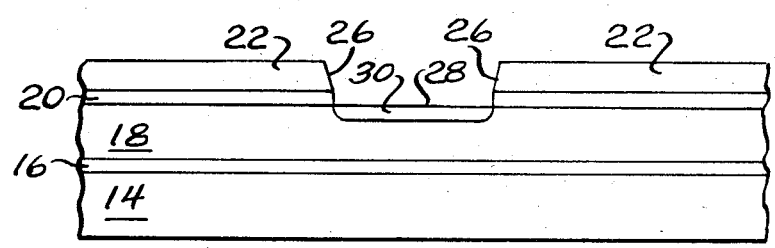

As shown in FIG. 2B, a reverse tone load implant mask 22 is utilized above the nitride layer 20 to expose an area 24 (FIG. 1) which is larger than and includes the regions which will become resistors 10. A reverse tone LIM is basically the geometric complement of a load implant mask.

Once mask 22 is in position, the exposed nitride (within rectangle 24) is etched away between walls 26 of mask 22. This exposes an area 28 on the surface of polysilicon layer 18.

A light dopant is introduced into area 28 through the opening in mask 22 to form a first doped region 30. This dopant can be boron which is implanted at 27 keV at $1 \times 10^{15} cm^2$, for example. This is a fairly low energy, so the boron will not enter the poly layer 18 very deeply—about 1500 Angstroms, although the implant could go deeper if desired. Region 30 within polysilicon layer 18 corresponds to the boundaries defined by the dashed rectangle 24 (of FIG. 1). The dopant introduced into doped region 30 is confined within rectangle 24 and is not present in the remainder of the polysilicon layer 18.

Figure 2C:
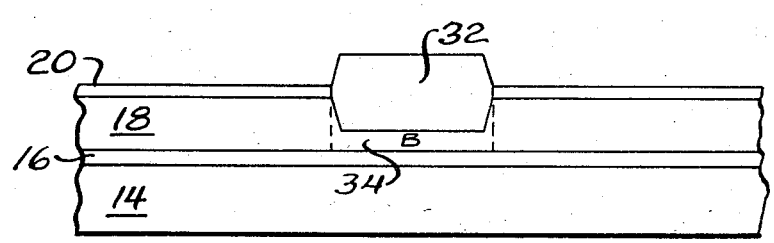

Once doped region 30 is initially established within the polysilicon 18, mask 22 is removed, and a second oxide layer 32 is grown, illustratively in a steam atmosphere at about 800°–950° C. Because of nitride layer 20, oxide 32 is grown only at the exposed surface of doped region 30. As the oxide 32 is grown, the dopant contained in doped region 30 is diffused through the remaining depth of polysilicon layer 18 to define a resistive region 34 in polysilicon layer 18. Also, as oxide 32 is grown, it consumes part of the polysilicon layer 18 so that the thickness of resistive region 34 is now less than the thickness of remaining portions of polysilicon layer 18. Once again, it will be appreciated from the illustration of FIG. 1 that this resistive region 34 will be within rectangle 24. This results in the structure illustrated in FIG. 2C.

Once the second oxide layer 32 has been grown to its desired or specified dimension (illustratively 4900 Angstroms), the nitride layer 20 is stripped.

Figure 2D:
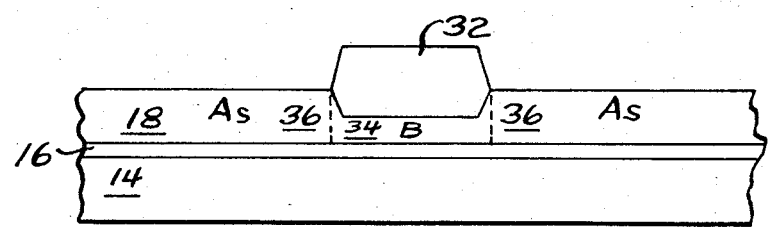

Next, the remaining portions of the polysilicon layer 18 are heavily doped with an impurity such as arsenic or phosphorous to establish relatively high conductivity regions 36 in polysilicon layer 18. This is shown in FIG. 2D. If conventional furnace doping is used, part of the polysilicon layer 18 is consumed in the heavily doped region. Normally the depth of polysilicon consumed is about 500 Angstroms. At this point the polysilicon layer 18 comprises the high conductivity regions 36 and the low conductivity (resistive) regions 34. None of the dopant used to define the region 34 is present in the high conductivity regions 36. Further, the doping of areas 36 was accomplished without the use of a poly doping mask (PDM). Instead, oxide 32 was grown and used to shield the lightly doped regions 34. At this juncture, the semiconductor structure comprises substrate 14 having a thin oxide layer 16 thereon. A polysilicon layer 18 covers the entire surface of the wafer and is divided into a resistive, lightly doped region 34 covered with oxide and highly conductive, heavily doped regions 36 not covered with oxide. The resistive region 34 and oxide 32 at this time are co-extensive with rectangle 24.

From FIG. 2D, significant advantages of the present invention can be noted. Specifically, the use of the second oxide layer 32 as the poly doping mask prevents the dopant which is used for the highly doped regions 36 from being intermingled with the dopant used to create the lightly doped region 34. Further, as long as excessively high temperature is avoided during the further processing of the chip, the dopant of the highly conductive regions 36 will not diffuse far enough into the lightly doped resistive region 34 to short it out. This particular problem may also be significantly reduced through the use of a boron implant to create a boron diode or a "nearly compensated diode" as described in my prior U.S. patent application entitled, "Polysilicon Resistor With Low Thermal Activation Energy" filed Dec. 15, 1982, having Ser. No. 449, 984. Also, if arsenic rather than phosphorous is used to dope the highly conductive regions 36, any problem with shorting is reduced since arsenic diffuses at a slower rate in poly than does phosphorus.

Also, because oxide 32 is grown onto the polysilicon layer 18 above the resistive region 34, a portion of the polysilicon layer 18 will have been consumed in the oxide growth process, and the resulting resistive region 34 can be made measurably thinner than the conductive regions 36. This is significant when it is desired to etch away the portion of the polysilicon layer 18 which lies between the desired polysilicon lines 12 illustrated in FIG. 1. A problem is presented because the lightly doped region 34 etches at a measurably slower rate than the highly doped regions 36. This problem is solved by creating a thinner poly layer in the lightly doped resistive regions through a poly-consuming growth of oxide 32. The depth to which second oxide layer 32 is grown into polysilicon layer 18 will be determined by the differences between the respective etching rates for the lightly doped regions 34 and the more heavily doped areas 36. This requires an arithmetic or algebraic determination depending also upon the particular dopants used for the respective regions of the polysilicon layer and the oxide-to-polysilicon selectivity of the etchant used to remove the second oxide layer 32.

Figure 3A:
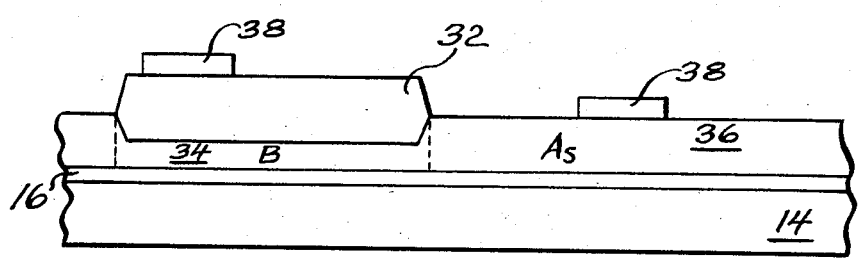
FIGS. 3A-C are cross-sectional views along line 3—3 of FIG. 1 at other varying times illustrating further process steps in the method of the present invention.
Figure 3B:
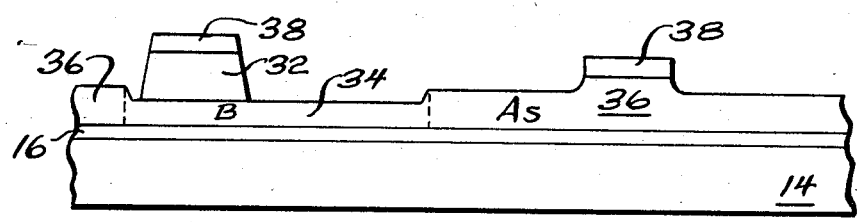
Figure 3C:
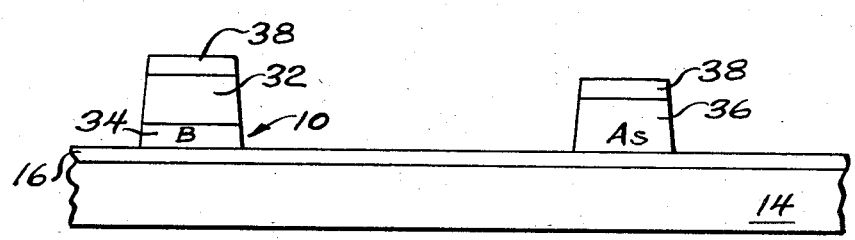

The next step in the preferred embodiment of the present invention further includes the process steps for etching away or removing the oxide and polysilicon between the to-be-defined polysilicon lines 12 as indicated in FIG. 1. This process is illustrated in the series of FIGS. 3A to 3C which are each cross-sectional views taken along the view line 3—3 in FIG. 1 at sundry times. In FIG. 3A, which illustrates the next step, a poly definition photoresist mask 38 is established on the surface of the wafer. Mask 38 extends along the edges of poly lines 12 in FIG. 1, as also illustrated in the cross-sectional view in FIG. 3A. Mask 38 may comprise virtually any geometric pattern depending upon the circuit to be fabricated and the corresponding geometry of the poly line(s) therein.

FIG. 3A also shows a resistive region 34 and a conductive region 36 along with oxide 32. There is a substantial portion of polysilicon and oxide which is not masked by the poly definition mask 38 and therefore must be etched away. In a preferred embodiment of the present invention, this is accomplished through a two step etching process where first oxide and then poly is etched. The oxide can be plasma etched, and should preferably have a selectivity of approximately 7:1 of oxide to polysilicon using, preferably, an anisotropic dry etch such as $CHF_3$ (called Freon 23) plus $C_2F_6$ (called Freon 116). Accordingly, the portion of oxide 32 which is not masked by poly definition mask 38 will be etched to expose a portion of the resistive region 34. This oxide etch will expose the portions of poly in rectangle 24 (FIG. 1) which are not covered by photoresist 38, leaving the resistive regions covered with oxide and the other poly areas bare. Also, because the etchant will typically have a selectivity of approximately 7:1, a small amount of the unmasked conductive poly regions 36 will be etched away during this time. The time period for which the oxide selective etchant is used will be determined by the rate at which it etches oxide and the thickness of the second oxide layer 32 to be removed.

Once the oxide etching step is completed, the wafer will appear as shown generally in FIG. 3B, a cross-sectional view along the lines 3—3 of FIG. 1. When the undesired portions of oxide 32 have been removed from between the poly lines defined by mask 38, the next step is to etch those undesired portions of the polysilicon layer 18 which are not masked by the poly definition mask 38. This is done through the use of a poly selective etchant such as chlorine which will etch the exposed poly at a much greater rate than oxide. In this process step, those portions of the resistive region 34 and the highly conductive regions 36 lying between desired poly lines 12, and not masked by the poly definition mask 38, will be removed. As mentioned above, the differing thickness of poly in the resistive region 34 and the highly conductive regions 36 will allow the poly in these two regions to be removed totally in approximately the same time period—even though they will etch at different rates because of the differences in their degrees of doping. As a result of this, damage to the underlying oxide layer 16 is minimal, if any. The resulting structure is illustrated in FIG. 3C, a cross-sectional view along the line 3—3 in FIG. 1.

Next, the poly definition mask 38 is removed, leaving poly lines 12 defined such as those illustrated generally in FIG. 1. As shown in FIG. 3C, these lines now contain a resistive region 34 (now called a resistor 10) which is covered by a thickness of oxide 32.

Figure 4A:
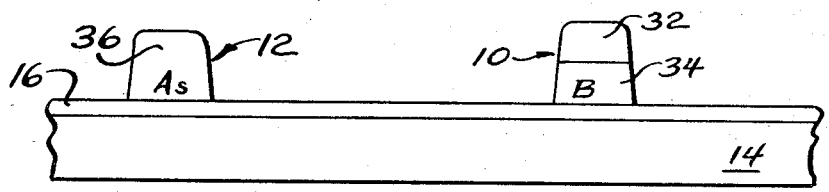
FIGS. 4A-4C are cross-sectional views along lines 4—4 and 4'—4' shown in FIG. 1 at various times illustrating further process steps in the fabrication of a semiconductor device according to the method of the present invention.
Figure 4B:
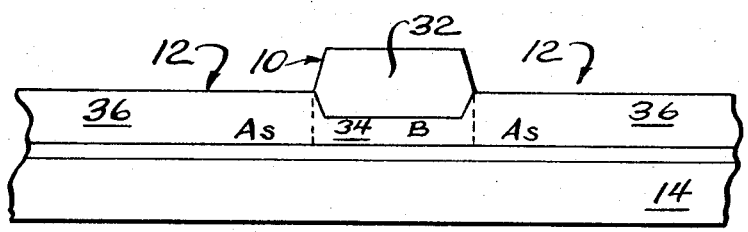

Having established polysilicon lines 12 each with a resistor 10, one can process the semiconductor further. The defined poly lines are shown in cross-section in FIG. 4A along the view line 4'—4' of FIG. 1. A lengthwise cross-section is shown in FIG. 4B along the view line 4—4 of FIG. 1. FIG. 4B illustrates the highly doped polysilicon regions 36, one of the resistors 10 (34) and oxide 32. These same elements are shown in the cross-sectional view of FIG. 4A along the line 4'—4'.

Figure 4C:
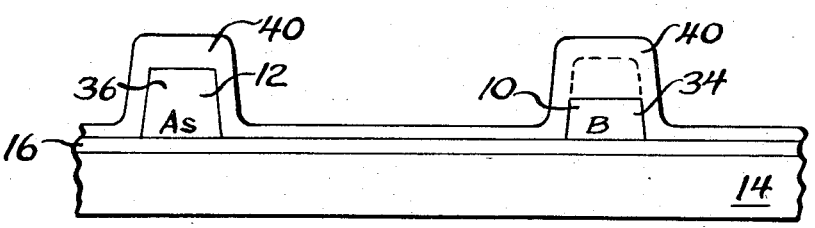

The process of the present invention may further include the development of an additional oxide layer on at least the exposed side walls of each resistor 10. This will prevent dopant from entering during subsequent processes. The oxide may be established by growth or deposition over the entire exposed surface of the wafer, and such an oxide 40 is shown in cross-section in FIG. 4C along the view line 4'—4'. The process of U.S. Pat. No. 4,486,943 can be used, and the subject matter thereof is incorporated hereby.

The process of the present invention may be compared with the standard process for forming source and drain implants around poly lines developed on a polysilicon substrate. The standard process requires a poly doping mask to heavily dope predetermined portions of the poly and a poly definition mask to define the poly lines. A further load implant mask (LIM) is then required to protect the load regions (the resistors) from the source/drain implant.

In contrast, the present invention uses a reverse load implant mask during the initial steps of the process to introduce a dopant into the resistive element area. The oxide 32 protects the resistors from any further implants, particularly during the remaining poly doping process. The present invention may use a poly definition mask to define the poly lines 12, after which the oxide growth on the poly lines 12 protects the resistors 10 (34) from the source and drain implants during the implantation process without the need for a further load implant mask.

The oxide above the poly lines 12 is developed to a thickness sufficient to prevent the penetration of the source/drain dopant at implanting energy levels. For example, the source and drain may be implanted with arsenic at 180 KeV at $5 \times 10^{15}/cm^2$. When this dosage is used at this energy level, the arsenic will penetrate only approximately 1600 Angstroms into the oxide. Accordingly, the shield 4900 Angstroms thick created by the second oxide layer 32 prevents the further doping of the resistors 34 without the need for a load implant mask over those regions.

The dimensions of the differing layers defined in the process of the present invention may vary over a substantially large range. In general, the thickness of any particular layer such as oxide layer 16 or nitride layer 20 is not critical to the successful utilization of the present method. It will be appreciated by those skilled in the art and familiar with the teachings of this specification that particular dimensions will generally be dictated by the desired characteristics of the semiconductor structure to be defined through the use of the present invention.

An exception to this general observation lies in the thickness of oxide 32 and the difference between the thickness of the resistive region 34 and the highly conductive regions 36 of poly layer 18. These dimensions are determined by the selectivity of the oxide etchant and the difference between the etching rates for the lightly doped, resistive regions 34 and heavily doped, highly conductive regions 36 of poly layer 18. Also, consideration may be given to the ultimately desired characteristics of the semiconductor structure.

The actual calculation of the thickness dimensions of resistive region 34, highly conductive regions 36, and oxide layer 32 will depend upon the types of dopant used. The dopants used for these regions and the degree of doping of each region determines their respective etching rates. The difference between the etching rates taken in conjunction with the selectivity of oxide etchant to oxide over poly will then determine the thicknesses of oxide layer 32, resistors 34, and conductive regions 36.

Typically this will be an empirical determination. For example, poly layer 18 may initially be developed to a thickness of about 6000 Angstroms. After the first few processing steps, the wafer configuration will generally be as shown in FIG. 2D. Oxide layer 32 may be about 4900 Angstroms thick while resistive region 34 may be approximately 3800 Angstroms thick. In contrast, conductive regions 36 may be about 5500 Angstroms in thickness. It has been found that these thicknesses are appropriate and satisfactory when resistive region 34 is implanted with boron at 27 keV and $1 \times 10^{15}/cm^2$ and conductive regions 36 are doped with arsenic to a concentration, near saturation, of about $10^{20}/cm^3$. Also, the etchant used to remove the nonmasked portions of oxide layer 32 in the poly definition step, preferably a dry etchant such as $CHF_3$ plus $C_2F_6$ may have a selectivity of about 7:1 of oxide to polysilicon. These dimensions, doping levels, dopants, and selectivity will typically be satisfactory for use in the present process and will allow the nearly simultaneous removal of the boron and arsenic doped regions of the nonmasked portions of the poly layer during the poly line definition step without unduly affected other desired aspects of the present invention.

Although the calculation of the actual dimensions and thicknesses of the respective layers is generally an empirical determination, it is possible to generalize the relationships between the various factors. The following formula generally defines the depth to which oxide layer 32 is grown into resistive region 34 to create a thinner poly layer in that region when the subsequent oxide etchant is 100% oxide selective:

$$y = x(1 - r_1/r_2) \quad (1)$$

wherein
Y=depth of oxide layer 32 into poly layer 18;
x=depth of poly layer 18 at conductive regions 36;
$r_1$=etching rate for lightly doped poly in resistors 34; and
$r_2$=etching rate for heavily doped poly in conductive regions 36.

The overall thickness of oxide layer 32 may then be calculated using the approximate conversion that for each 1000 Angstroms of oxide grown, 450 Angstroms of polysilicon is consumed. Thus, overall thickness of oxide layer 32 may be approximated by the formula:

$$x_o = y/0.45 \quad (2)$$

Thus, once the desired dopants and thickness of the poly layer are selected, all other thickness may be calculated.

In actual operation, the selectivity of the oxide etchant is not 100%, and therefore, it must be taken into consideration. The selectivity of an etchant may be readily defined as the ratio of the etching rate for the "selected" substance, e.g. oxide, to the etching rate for the "nonselected" substance, e.g. poly. A typical oxide etchant may have a selectivity of 7:1.

The desired result in the method of the present invention is to utilize a sufficiently selective oxide etchant so that the conductive regions 36 will still be sufficiently thicker than the resistors 34 to allow both to be entirely removed in the same time even though some of the poly in highly doped regions 36 will be removed during the oxide etching. A negligible amount of poly will be removed from lightly doped regions 34 because the etching time will correspond to the time typically necessary to remove the oxide layer 32 overlying lightly doped regions 34 and the etch will be terminated accordingly. The selectivity of the oxide etchant further contributes to this feature.

In a preferred embodiment, before the oxide etch, the structure of the wafer will appear as shown generally in FIG. 2D with oxide layer 32 being 4900 Angstroms, lightly doped region 34 being 3500 Angstroms, and heavily doped region 36 being 5500 Angstroms after a 500 Angstrom loss caused by the doping process. Thus, with an oxide etchant such as $CHF_3$ having a 7:1 selectivity, the wafer will appear after the oxide etch as shown generally in FIG. 3B wherein all of the unmasked portion of oxide layer 32 are removed to expose portions of lightly doped region 34. Also, approximately 700 Angstroms of poly has been removed from the unmasked areas of heavily doped regions 36. Thus, about 4800 Angstroms of heavily doped poly and 3800 Angstroms of lightly doped poly remain to be removed from the unmasked regions during the poly etch. These dimensions are appropriate when regions 34 is doped with boron and region 36 are doped with arsenic in the concentrations given above and when the ratio of etch rates of heavily doped poly to lightly doped poly is about 1.3:1.

More generally the interrelationship of these various factors may be given by the following formula:

$$y = x[1 - (r_1/r_2)(1 - 1/s_1)] - \text{delta} \quad (3)$$

wherein y, x, $r_1$, and $r_2$ are defined for equation (1) above;

delta = the thickness of poly used up in the heavily doped region by the doping process itself; and $S_1$ = selectivity of oxide etchant: ratio of oxide etching rate to heavily doped poly etching rate.

It should be noted that $$y = x - z - \text{delta} \quad (4)$$

where z is the thickness of poly layer 18 in lightly doped regions 34. Likewise, the relationship of equation (2) is still valid. Accordingly, the dimensions to be defined in the process of the present invention may be determined depending upon the desired dopants and overall thickness of the poly layer 18.

The doping of the various semiconductor layer in the assorted process steps may be accomplished in a number of acceptable, conventional processes. For example, boron may be implanted into poly layer 18 in regions 30 in a conventional implantation process. The oxide layer 32 may be grown in steam of 800° to 950° C. or it may be grown in other conventional ways.

The heavy doping of poly layer 18 at conductive regions 36 may be accomplished through furnace doping, implantation, spin-on glass, or otherwise. For example, a predep machine may be used to facilitate the process, and the dopant may be any acceptable dopant such as arsenic or phosphorous depending upon the desired characteristics of the final circuit. In this step, the oxide layer 32 acts as a mask as explained above.

Additional doping, such as source/drain implantation, may be accomplished in any number of conventional ways depending on the desired characteristics of the final circuit. Likewise, the degree of doping may similarly vary.

The present invention has been described above in terms of a preferred embodiment. Such changes and modifications as would be apparent to one skilled in the art and familiar with the teachings of this application are deemed to be within the spirit and scope of the present invention. For example, rather than developing the silicon nitride layer 20 directly on the poly layer 18, a very thin oxide layer may first be developed to at least partially protect the poly from the nitride.

Thus it will be seen that the present invention provides a method for fabricating resistors in polysilicon without unduly affecting the conductivity of other areas of a poly layer. The present invention also allows the uniform removal of both lightly doped and more heavily doped regions of a poly layer during etching (which is typically used to define poly lines) without adversely affecting the underlying oxide or substrate. Further, the present invention provides for the fabrication of semiconductor devices through a reduced number of discrete masking steps.

What is claimed is:

1. In a process for fabricating polysilicon resistors over a substrate having a poly layer, including steps of doping the poly with impurities for the resistor, doping the poly for conductivity, and poly definition, the improvement comprising:

establishing a covering over the poly layer adequate to shield the underlying poly from impurities to be introduced to the poly; then providing openings in the covering to expose areas of poly; then entering impurities into the exposed areas of poly in a concentration to establish a resistive region, said covering operating to shield the underlying poly from said impurities;

establishing a protective mask over the poly wihtout an additional masking step after said impurities have entered said exposed areas of poly; and then further processing the resulting structure including removing parts of said covering and entering impurities into further areas of the poly using the protective mask in a concentration to render conductive said further areas of poly, and defining both said resistive region and said conductive areas of the poly to include a poly line having a part which is conductive and a part which is resistive.

2. In a process for fabricating a semiconductor device having a source, a drain, and a poly resistor, the process being executed on a poly layer disposed over a substrate and including steps of using a poly definition mask to define a poly line and using a load implant mask in connection with introducing source and drain impurities into the substrate, the improvement comprising:

(A) before using a poly definition mask, applying a reverse tone load implant mask to the poly layer and introducing a low concentration of impurities into a designated resistor area of the poly while said reverse tone mask is in place, said reverse tone mask being used as a shield; then (B) establishing an oxide over the designated resistor areas; then (C) introducing into other areas of poly not covered by said oxide impurities in a concentration sufficient to make said other areas conductive while using said oxide as a shield to prevent said designated resistor area from becoming conductive; then (D) defining the poly to include a poly line having a resistive region and a conductive region; then (E) introducing source and drain impurities without using a further, separate load implant mask, whereby said structure is fabricated without requiring a separate poly doping mask, a separate poly definition mask, and a separate load implant mask.

3. The improvement of claim 2 wherein step (A) includes covering the poly with a layer; then opening areas corresponding to a designated resistor area; then doping the designated resistor area with impurities.

4. The improvement of claim 3 wherein said layer is nitride and said step (A) includes using a reverse tone load implant mask in connection with the nitride layer, etching openings through the nitride layer to expose said designated resistor area, and doping the opened area.

5. The improvement of claim 3 wherein step (B) includes growing an oxide suitable for masking the underlying poly against heavy doping, said oxide being grown only on poly exposed by said openings.

6. The improvement of claim 5 wherein step (C) includes stripping the layer covering the poly but leaving oxide over the designated resistor area.

7. The improvement of claim 5 wherein said step (B) includes growing said oxide to reduce the poly at the designated resistor area to a predetermined thickness, and wherein step (D) includes etching selected areas of the poly, the predetermined thickness being such that the etching of poly doped in step (A) will require about the same amount of time for the etching of the poly doped in step (C).

8. The method of claim 2 further including establishing further oxide on the poly after step (D) and before step (E).

9. An improved method for fabricating a semiconductor circuit having a resistor in a polysilicon layer separated from an underlying substrate by a first insulating layer, the method comprising:

doping a first area of said polysilicon layer to a first impurity level to render said first area resistive; then establishing a second insulation layer over said first area of said polysilicon layer suitable for use as a mask against doping; then doping second areas of said polysilicon layer to a second impurity level to render said second areas conductive, while said second insulation layer blocks further doping of said first area of said polysilicon layer; then defining said polysilicon layer to include a resistor formed from said first area in a conductive line formed from said second areas.

10. The method of claim 9 wherein said establishing a second insulation layer comprises partially oxidizing said first area of said polysilicon layer so that the thickness of polysilicon in said first area of said polysilicon is reduced.

11. The method of claim 10 wherein said defining step leaves said first insulation layer substantially intact.

12. The method of claim 10 wherein said doping a first area of said polysilicon layer comprises:

developing a nitride layer on said polysilicon layer;

masking said nitride layer to expose only an area thereof corresponding to said first area;

etching said said exposed area of nitride to define an opening in said nitride corresponding to said first area of said polysilicon layer; and doping said first area of said polysilicon layer through said opening in said nitride layer.

13. The method of claim 12 wherein said doping second areas of said polysilicon layer includes, after establishing a second insulation layer, removing said nitride layer and then doping the exposed polysilicon layer to a second impurity level while using said second insulation layer as a mask against further doping of said first area of said polysilicon layer.

14. The method of claim 13 wherein said defining step and said other steps cooperate to define a polysilicon line upon a substantially intact, partially exposed first insulation layer.

15. The method of claim 14 wherein said defining step comprises:

applying a poly definition mask; then selectively etching exposed areas of said second insulation layer; and then selectively etching all of the exposed polysilicon layer to define a polysilicon line containing a resistive region.

16. The method of claim 15 wherein said step of selectively etching exposed areas of said second insulation layer comprises etching unmasked areas of said second insulation layer with an etchant which etches said insulation at a rate which is greater then the rate at which said etchant etches polysilicon.

17. A method for fabricating a polysilicon line having a first region doped to a first impurity level, said first region being resistive, and second regions doped to a second impurity level, said second regions being conductive, said poly line being located above a substrate including:

developing a first insulation layer on said substrate;

developing a polysilicon layer of a predetermined depth on said first insulation layer;

doping a selected first area of said polysilicon layer to a first impurity level for low conductivity;

establishing a second insulation layer on said first area of said polysilicon layer and reducing said first area of said polysilicon layer in thickness; and doping selected second areas of said polysilicon layer to a second impurity level for high conductivity; and defining said polysilicon layer to include a resistor formed from said first area in a conductive line formed from said second areas.

18. The method of claim 17 wherein said second impurity level is greater than said first impurity level wherein said defining step includes:

etching said polysilicon layer and said second insulation layer in a selected pattern to expose said first insulation layer to define polysilicon lines so that said first and second areas of said polysilicon layer are defined in about the same time and said first insulation layer is left substantially intact.

19. The method of claim 17 wherein said doping a selected first area comprises:

developing a nitride layer on said polysilicon layer;

masking said nitride layer to expose only a first load area;

etching said nitride in said first load area to define an opening in said nitride to expose said selected first area of said polysilicon layer; and doping said selected first area of said polysilicon layer through said opening in said nitride layer.

20. The method of claim 17 wherein said doping selected second areas of said polysilicon layer comprises doping the exposed polysilicon layer to a second impurity level while using said second insulation layer as a poly doping mask.

21. The method of claim 20 wherein said defining step includes: etching said polysilicon layer and said second insulation layer comprises:

masking said polysilicon layer and said second insulation layer to define a pattern of masked strips and exposed areas; and etching said exposed areas to define a polysilicon line having a substantially intact, exposed first insulation layer adjacent thereto.

22. The method of claim 21 wherein said etching comprises:

selectively etching exposed areas of said second insulation layer to expose said reduced thickness polysilicon layer in said first impurity areas of said polysilicon; then selectively etching all of the exposed areas of said polysilicon layer to expose said first insulation layer to define a plurality of polysilicon lines, whereby said first insulation layer is left substantially intact.

23. The method of claim 22 wherein said selectively etching exposed areas of said second insulation layer comprises etching all exposed areas of said second insulation layer with an etchant which etches said insulation at a rate greaater than the rate at which said etchant etches polysilicon.

24. A method for fabricating a resistor on a silicon substrate including:

developing a first layer of oxide on said substrate;

developing a layer of polysilicon having a predetermined thickness on said first oxide layer;

developing a layer of nitride on said polysilicon layer;

etching said nitride layer to expose a first area of said polysilicon layer; then doping said first area to a first impurity level to establish a resistive region in said polysilicon layer where said resistor is to be located;

growing a second oxide on said resistive region;

removing said nitride layer;

doping the polysilicon layer to a second impurity level suitable for conductivity while using said second oxide as a doping mask to shield said resistive region from further substantial doping; and then defining said polysilicon to include a conductive line containing a resistor.

25. The method of claim 24 wherein said first impurity level is less than said second impurity level.

26. The method of claim 24 wherein said growing a second oxide comprises growing a second oxide of a selected dimension to a predetermined depth in said resistive region to thin said polysilicon layer in said resistive region.

27. The method of claim 26 wherein said growing a second oxide comprises growing a second oxide to the depth of y where y is approximately determined by the formula comprising:

$$y = x(1 - r_1/r_2)$$

wherein y = the depth of said second oxide into said polysilicon layer in said resistive area;

x = depth of said polysilicon layer doped to said second impurity level;

$r_1$ = etching rate for polysilicon doped to said first impurity level; and $r_2$ = etching rate for polysilicon doped to said second impurity level.

28. The method of claim 24 wherein said etching said polysilicon layer comprises:

masking said polysilicon layer and said second oxide layer to define masked strips and exposed areas; and etching said exposed areas to define a plurality of polysilicon lines on said substrate, at least one of said lines having a resistor therein, said first oxide layer being left substantially intact.

29. The method of claim 28 wherein said exposed areas include portions of said second oxide and wherein said etching said exposed areas comprises:

selectively etching said exposed areas of said second oxide to expose said thinner polysilicon layer in said resistive region between said masked strips; then selectively etching said exposed areas of polysilicon and said resistive region between said masked strips to expose said first oxide layer to define a plurality of polysilicon lines, at least one of said lines having a resistor therein, said first oxide layer being left substantially intact.

30. The method of claim 29 wherein said selectively etching said exposed areas of said second oxide comprises etching said exposed areas of said second oxide with an ethant which selectively etches oxide at a selected rate greater than the rate at which said etchant etches polysilicon.

31. The method of claim 30 wherein said second oxide is grown to the depth of y where y is approximately determined by the formula:

$$y = x\left[1 - \frac{r1}{r2}\left(1 - \frac{1}{s1}\right)\right] - \Delta$$

wherein y = the depth of said second oxide into said polysilicon layer in said resistive area;

x = depth of said polysilicon layer; doped to said second impurity level;

$s_1$ = ratio of the rate of etching of oxide by said etchant to the rate of etching of polysilicon by said etchant;

$r_1$ = etching rate for polysilicon doped to said first impurity level; and $\Delta$ = the thickness of polysilicon consumed in said polysilicon layer doped to said second impurity level by the doping process itself.

* * * * *